US009276584B2

(12) United States Patent
Au Yeung et al.

(10) Patent No.: US 9,276,584 B2
(45) Date of Patent: Mar. 1, 2016

(54) COMPENSATED OSCILLATOR

(71) Applicant: VIXS SYSTEMS INC., Toronto (CA)

(72) Inventors: Chung Fai Au Yeung, Ngau Chi Wan (CN); Michael Cave, Austin, TX (US)

(73) Assignee: ViXS Systems Inc., Toronto (CA)

( * ) Notice: Subject to any disclaimer, the term of this patent is extended or adjusted under 35 U.S.C. 154(b) by 51 days.

(21) Appl. No.: 14/186,661

(22) Filed: Feb. 21, 2014

(65) Prior Publication Data

US 2015/0244377 A1    Aug. 27, 2015

(51) Int. Cl.
*H03L 1/00* (2006.01)
*H03L 1/02* (2006.01)

(52) U.S. Cl.
CPC .. *H03L 1/00* (2013.01); *H03L 1/02* (2013.01); *H03L 1/021* (2013.01); *H03L 1/026* (2013.01)

(58) Field of Classification Search
CPC ............ H03L 1/026; H03L 1/02; H03L 1/021
USPC .......................... 331/176, 183, 57, 16, 34, 17
See application file for complete search history.

(56) References Cited

U.S. PATENT DOCUMENTS 8,736,387 B2 * 5/2014 Mahooti et al. ............... 331/143

* cited by examiner

*Primary Examiner* — Arnold Kinkead (57) ABSTRACT

An oscillator includes a compensated current source that adjusts an output current based on process, supply voltage, and temperature ("PVT") variations of an integrated circuit device. The oscillator generates an output signal having a frequency based, in part, on the output current of the compensated current source. Accordingly, the output signal has a relatively low sensitivity to PVT variations.

18 Claims, 5 Drawing Sheets

COMPENSATED OSCILLATOR

FIELD OF THE DISCLOSURE

The present disclosure generally relates to oscillators.

BACKGROUND

An oscillator circuit is sometimes employed in integrated circuit devices to generate a periodic output signal to synchronize device operations. For example, the oscillator circuit can be employed to generate a clock signal that synchronizes the latching of data at a module of the integrated circuit device, thereby ensuring that the logic devices of the module behave in a predictable way. To ensure the desired behavior of the module, it is typically desirable that the output signal of the oscillator be generated to have a specified frequency, within a specified tolerance. However, variations in the process used to manufacture the integrated circuit device, variations in device temperature during operation, and variations in the supply voltage of the integrated circuit device can cause drift, jitter, frequency variations, or other perturbations in the oscillator circuit's output signal. If they are too large, these perturbations can cause errors in the behavior of the integrated circuit device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-7 illustrate an oscillator including a compensated current source that adjusts an output current based on process, supply voltage, and temperature ("PVT") variations of an integrated circuit device. The oscillator generates an output signal having a frequency based, in part, on the output current of the compensated current source. Accordingly, the output signal has a relatively low sensitivity to PVT variations. In addition, the output current can be generated using a relatively low supply voltage, allowing the integrated circuit device to save power.

Figure 1:
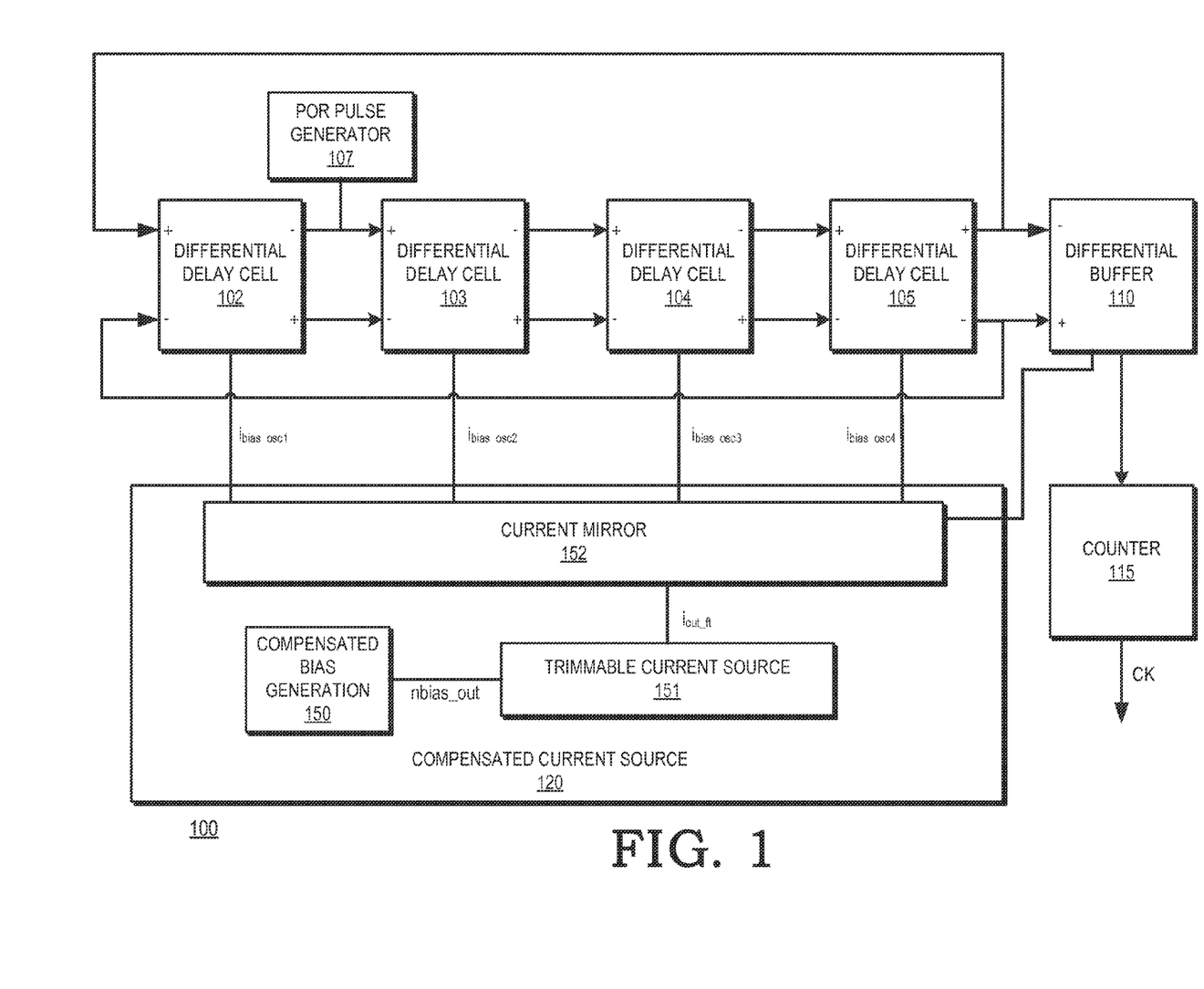
FIG. 1 is a block diagram illustrating an oscillator in accordance with at least one embodiment of the present disclosure.

FIG. 1 illustrates an oscillator 100 in accordance with at least one embodiment. The oscillator 100 is incorporated into an integrated circuit device, such as a general-purpose processor, video coder/decoder, graphics processor, and the like, to generate an oscillating output signal, labeled "CK" in FIG. 1. In at least one embodiment, the oscillating output signal is a digital clock signal used to synchronize the operations of logic modules (not shown) of the integrated circuit device. For example, in at least one embodiment the CK signal is generated to synchronize the operations of a security module of the integrated circuit device, wherein the security module is used to authenticate the integrated circuit device for execution of secure software. Because, as described below, the CK signal is a stable signal that is resistant to PVT variations, its frequency can be set with relatively high precision. This renders the CK signal difficult to spoof by a user or device that seeks to exploit the security module.

The oscillator includes differential delay cells 102-105, a power-on-reset (POR) pulse generator 107, a differential buffer 110, a counter 115, and a compensated current source 120. The differential delay cell 102 includes a non-inverting input, an inverting input, a non-inverting output, and an inverting output. The differential delay cell 103 includes a non-inverting input connected to the inverting output of the differential delay cell 102, an inverting input connected to the non-inverting output of the differential delay cell 102, a non-inverting output, and an inverting output. The differential delay cell 104 includes a non-inverting input connected to the inverting output of the differential delay cell 103, an inverting input connected to the non-inverting output of the differential delay cell 103, a non-inverting output, and an inverting output. The differential delay cell 105 includes a non-inverting input connected to the inverting output of the differential delay cell 104, a inverting input connected to the non-inverting output of the differential delay cell 104, a non-inverting output connected to the non-inverting input of the differential delay cell 102, and a inverting output connected to the inverting input of the differential delay cell 102.

The differential buffer 110 includes an inverting input connected to the non-inverting output of the differential delay cell 105, a non-inverting input connected to the inverting output of the differential delay cell 105, and an output. The counter 115 includes an input connected to the output of the differential buffer 110 and an output to provide a clock signal labeled "CK". The compensated current source 120 includes outputs connected to corresponding ones of the differential delay cells 102-105 and the differential buffer 110. The POR pulse generator 107 includes an output connected to the non-inverting input of the differential delay cell 103.

Each of the differential delay cells 102-105 is generally configured to receive a differential signal via the corresponding positive and inverting inputs and provide an inverted and delayed differential representation of that input differential signal at the corresponding positive and inverting outputs. Because the outputs of the differential delay cell 105 are connected to the corresponding inputs of the differential delay cell 102, the differential delay cells 102-105 collectively generate an oscillating differential output signal at the output of the differential delay cell 105. In at least one embodiment, the arrangement of the differential delay cells 102-105 is such that the oscillator 100 satisfies the Barkhausen stability criterion. The frequency of the output signal is dependent on the delay introduced by each of the differential delay cells 102-105. In at least one embodiment, the delay introduced by each of the differential delay cells 102-105 depends on a corresponding bias current (labeled "$i_{bias\_osc1}$", "$i_{bias\_osc2}$", "$i_{bias\_osc3}$", and "$i_{bias\_osc4}$", respectively). As explained further below, each of these bias currents is generated to have substantially the same magnitude, so that each of the differential delay cells 102-105 introduces a substantially similar delay to its corresponding differential input signal. In addition, the bias currents are generated to be resistant to PVT variations at the integrated circuit device, so that the frequency of the output signal is stable.

The differential buffer 110 is configured to convert a differential input signal received at its non-inverting and inverting inputs to a single-ended signal provided at its output. In at least one embodiment, the single-ended output signal is a digital logic compatible signal suitable for generation of the CK signal. That is, the single-ended output signal oscillates between a voltage corresponding to an "asserted" logic level and a voltage corresponding to a "negated" logic level.

The counter 115 is configured to increment a stored value in response to edges of the digital logic compatible signal received at its input, until the stored value reaches a threshold level. Once the threshold level is reached, the counter 115 passes the digital logic compatible signal to its output as the signal CK. The threshold level is set so that, after reset of the oscillator 100, the counter 115 does not pass the digital logic compatible signal generated by the differential buffer 110 to its output until the digital logic compatible signal is expected to have reached a stable frequency. This ensures that the CK signal does not begin to synchronize logic operations until the stable frequency has been reached.

The POR pulse generator 107 is configured to generate a pulse in response to a power-on-reset event at the oscillator 100, such as a reset of the corresponding integrated circuit device. The pulse sets the non-inverting input of the differential delay cell 103 to a known state, thereby ensuring the CK signal is a stable signal having the expected frequency. In at least one embodiment, the POR pulse generator can also include a connection to the inverting input of the differential delay cell 103, so that the pulse sets both the inverting and non-inverting inputs of the differential delay cell 103 to known states. In the absence of the pulse, after the power-on-reset event, one or more of the inputs of the differential delay cells 102-105 can be in an indeterminate state, causing unpredictable behavior in the CK signal, such as the signal failing to achieve a stable frequency.

In operation, after a power-on-reset event, the POR pulse generator applies a pulse at the differential input of the differential delay cell 103. The pulse is propagated through the differential delay cells 104, 105, and 102, thus initiating generation of an oscillating differential signal at the output of the differential delay cell 105. The oscillating differential signal is generated such that, after a specified start-up time (designated "$T_{START}$") it has a frequency designated $f_{OUT}$. The differential buffer 110 converts the oscillating differential signal to a single-ended output signal, which is provided to the counter 115.

The threshold for the counter 115 is set to a value corresponding to a time greater than $T_{START}$. The value stored by the counter 115 is reset to zero in response to the power-on-reset event, and the counter 115 increments the value in response to edges of the single-ended signal generated by the differential buffer 110. After the time $T_{START}$, the single-ended signal has reached the stable output frequency $f_{OUT}$ and the counter 115 provides the single ended signal as the clock signal CK.

As explained above, the frequency $f_{OUT}$ of the signal CK is dependent on the bias currents $i_{bias\_osc1}$, $i_{bias\_osc2}$, $i_{bias\_osc3}$, and $i_{bias\_osc4}$, generated by the compensated current source 120. To generate the bias currents, the compensated current source 120 includes a compensated bias generation module 150 connected to a trimmable current source 151, which is in turn connected to a current mirror 152 that generates the bias currents $i_{bias\_osc1}$, $i_{bias\_osc2}$, $i_{bias\_osc3}$, and $i_{bias\_osc4}$.

The compensated bias generation module 150 generates a bias voltage, designated "nbias_out", having a magnitude that is stable in the face of PVT variations within a specified range. In at least one embodiment, the compensated bias generation module 150 includes a circuit that generates a current that is proportional to the temperature of the integrated circuit device (a PTAT current) and a circuit that generates a current that is complementary to the temperature of the integrated circuit device (a CTAT current). The PTAT and CTAT current are combined and applied to a set of resistors to form a voltage that is resistant to variations in temperature of the integrated circuit device. The voltage is applied to a transistor to generate a current that varies based on a supply voltage of the oscillator 100. This varying current is subtracted from the combined current generated based on the PTAT and CTAT currents. The resulting current is used to generate nbias_out, which is therefore resistant to temperature variation and variations in the supply voltage.

The trimmable current source 151 is configured to generate a current, designated "$i_{out\_ft}$" based on the voltage nbias_out. The current $i_{out\_ft}$ can be adjusted ("trimmed") after manufacture of the integrated circuit device that includes the oscillator 100 to set the current $i_{out\_ft}$ to a specified level. For example, in one embodiment the trimmable current source 151 adjusts the current $i_{out\_ft}$ based on a value stored at a set of fuses or one-time-programmable ("OTP") register (not shown). After manufacture of the integrated circuit device, a test system can test the magnitude of $i_{out\_ft}$ and set the value at the set of fuses or OTP register so that $i_{out\_ft}$ is adjusted to the specified value. This ensures process variations during manufacture of the integrated circuit do not affect the magnitude of $i_{out\_ft}$. Accordingly, the magnitude of the current $i_{out\_ft}$ is resistant to voltage and temperature variations because it is based on the voltage nbias_out and is resistant to process variations because any such variations can be accounted for during trimming. In at least one embodiment, the current $i_{out\_ft}$ is proportional to the absolute temperature of the integrated circuit device in order to compensate for temperature effects at the differential delay cells 102-105.

The current mirror 152 receives the current tout ft and mirrors that current to generate each of the bias currents $i_{bias\_osc1}$, $i_{bias\_osc2}$, $i_{bias\_osc3}$, and $i_{bias\_osc4}$. The bias currents therefore have substantially the same magnitude, so that each of the differential delay cells 102-105 introduce substantially the same delay to the differential signal at their corresponding inputs. Further, because they are based on the current $i_{out\_ft}$, each of the bias currents $i_{bias\_osc1}$, $i_{bias\_osc2}$, $i_{bias\_osc3}$, and $i_{bias\_osc4}$ is resistant to PVT variations at the integrated circuit device. This ensures that the frequency $f_{out}$ of the signal CK is similarly resistant to such PVT variations.

Figure 2:
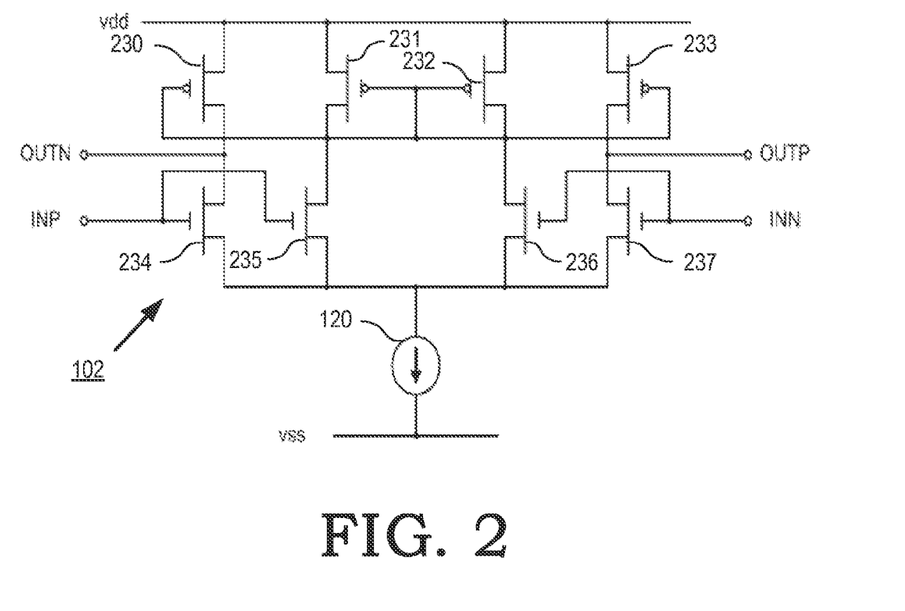
FIG. 2 is a circuit diagram of a delay cell and portion of a compensated current source of the oscillator of FIG. 1 in accordance with one embodiment of the present disclosure.

FIG. 2 illustrates a circuit diagram of the differential delay cell 102 as connected to the compensated current source 120 in accordance with at least one embodiment. The differential delay cell 102 includes p-type transistors 230-233 and n-type transistors 234-237. The transistor 230 includes a first current electrode connected to a voltage reference (labeled "VDD"), a second current electrode connected to the inverting output (labeled "OUTN") of the differential delay cell, and a control electrode. The transistor 231 includes a first current electrode connected to the VDD voltage reference, a second current electrode connected to the control electrode of the transistor 230, and a control electrode connected to the second current electrode of the transistor 231. The transistor 232 includes a first current electrode connected to the VDD voltage reference, a second current electrode connected to the control electrode of the transistor 230, and a control electrode connected to the second current electrode of the transistor 232. The transistor 233 includes a first current electrode connected to the VDD voltage reference, a second current electrode connected to the non-inverting output (labeled "OUTP"), and a control electrode connected to the control electrode of the transistor 230.

The transistor 234 includes a first current electrode connected to the inverting output of the differential delay cell 102, a second current electrode connected to the current source 120, and a control electrode connected to the non-inverting input (labeled "INP") of the differential delay cell 102. The transistor 235 includes a first current electrode connected to the second current electrode of the transistor 231, a second current electrode connected to the current source 120, and a control electrode connected to the non-inverting input of the differential delay cell 102. The transistor 236 includes a first current electrode connected to the second current electrode of the transistor 232, a second current electrode connected to the current source 120, and a control electrode connected to the inverting input (labeled "INN") of the differential delay cell 102. The transistor 237 includes a first current electrode connected to the non-inverting output of the differential delay cell 102, a second current electrode connected to the current source 120, and a control electrode connected to the inverting input of the differential delay cell 102.

In operation, when the differential signal at the positive and inverting inputs is such that the voltage difference at the inputs represents an asserted logic signal, the conductivity of each of the transistors 230-237 is set so that the voltages at the non-inverting and inverting outputs are set to magnitudes whereby the resulting differential signal represents a negated logic level. When the voltage difference at the non-inverting and inverting inputs changes so that the differential input signal represents a negated logic level, the conductivity of the transistors 230-237 changes so that the voltages at the non-inverting and inverting outputs are set to magnitudes whereby the resulting differential signal represents an asserted logic level. The speed with which the conductivity changes, and therefore the frequency of the CK signal, depends on the magnitude of the bias current $i_{bias\_osc1}$ generated by the compensated current source 120.

In addition, in the illustrated example of FIG. 2, the differential delay cell 102 is arranged as a symmetrical around the current source 120. This ensures that the current $i_{bias\_osc1}$ either sources current or sinks current depending on whether the differential signal at the non-inverting and inverting inputs represents an asserted or negated logic level. Further, the symmetrical arrangement ensures that substantially the same amount of current will be sourced or sunk into the input capacitance of the next stage of the oscillator 100. This ensures that the rise and fall times of the differential signal provided at the non-inverting and inverting outputs.

Figure 3:
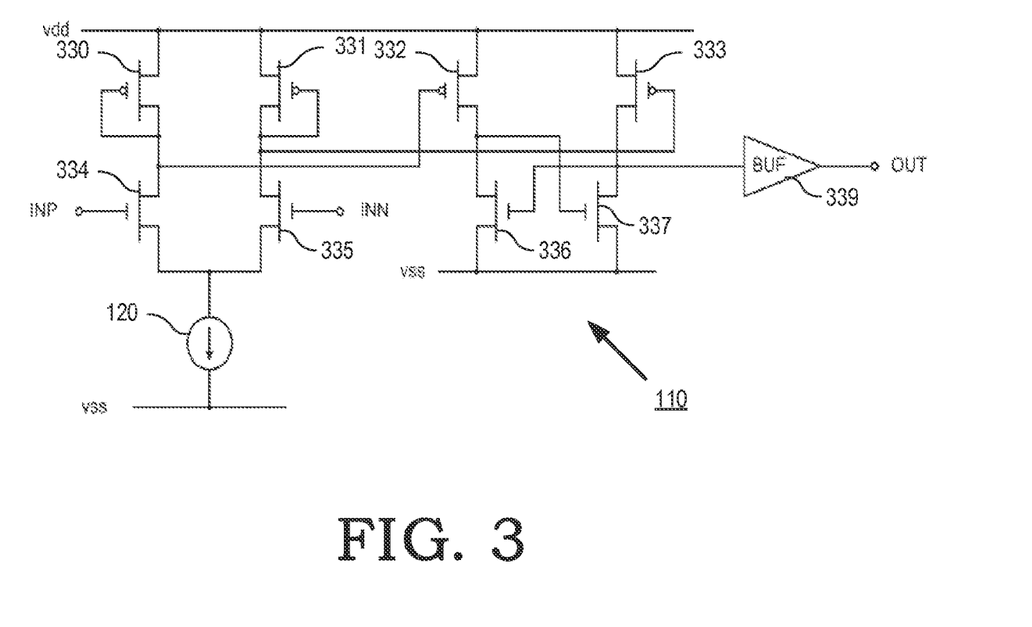
FIG. 3 is a circuit diagram of a differential buffer of the oscillator of FIG. 1 in accordance with at least one embodiment of the present disclosure.

FIG. 3 illustrates a circuit diagram of the differential buffer 110 as connected to the compensated current source 120 in accordance with at least one embodiment. The differential buffer 110 includes p-type transistors 330-333, n-type transistors 334-337, and a buffer 339. The transistor 330 includes a first current electrode connected to a voltage reference (labeled "VDD"), a second current electrode, and a control electrode connected to the second current electrode of the transistor 330. The transistor 331 includes a first current electrode connected to the VDD voltage reference, a second current electrode, and a control electrode connected to the second current electrode of the transistor 331. The transistor 332 includes a first current electrode connected to the VDD voltage reference, a second current electrode, and a control electrode connected to the second current electrode of the transistor 330. The transistor 333 includes a first current electrode connected to the VDD voltage reference, a second current electrode, and a control electrode connected to the second current electrode of the transistor 331.

The transistor 334 includes a first current electrode connected to the second current electrode of the transistor 330, a second current electrode connected to the current source 120, and a control electrode connected to the non-inverting input (labeled "INP") of the differential buffer 110. The transistor 335 includes a first current electrode connected to the second current electrode of the transistor 331, a second current electrode connected to the current source 120, and a control electrode connected to the inverting input (labeled "INN") of the differential buffer 110. The transistor 336 includes a first current electrode connected to the second current electrode of the transistor 332, a second current electrode connected to a voltage reference labeled "VSS", and a control electrode connected to the second current electrode of the transistor 333. The transistor 337 includes a first current electrode connected to the second current electrode of the transistor 333, a second current electrode connected to the VSS voltage reference, and a control electrode connected to the second current electrode of the transistor 332. The buffer 339 includes an input connected to the second current electrode of the transistor 333 and an output to provide the output for the differential buffer 110.

In operation, the circuit formed by the transistors 330, 331, 334, and 335 and the compensated current source 120 invert the differential signal received at the non-inverting and inverting inputs of the differential buffer 110. The resulting inverted differential signal is converted to a single-ended signal by the circuit formed by the transistors 332, 333, 336 and 337. The single-ended signal is provided to the buffer 339, which drives the single ended signal as a digital logic compatible signal at the output of the differential buffer 110.

Figure 4:
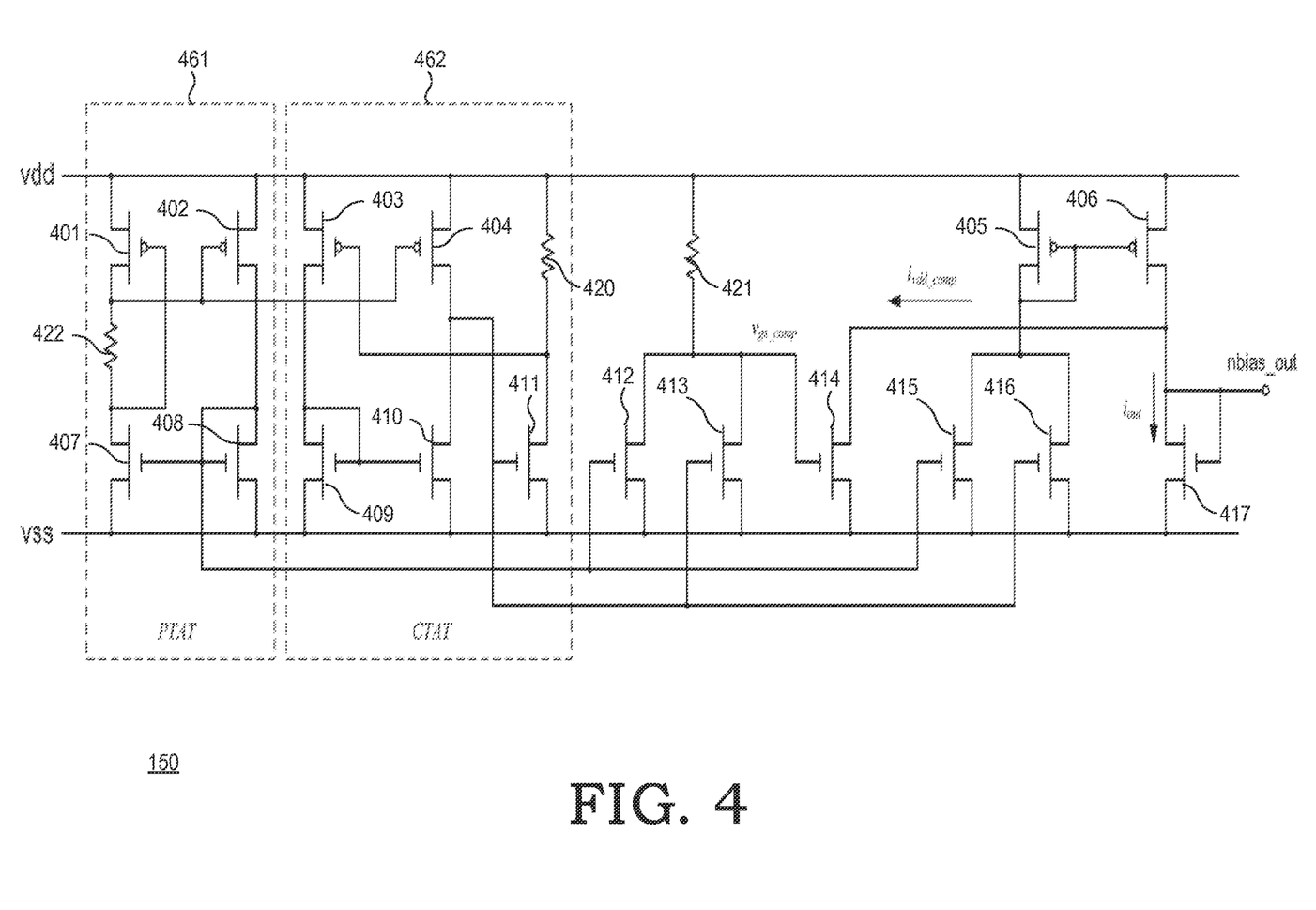
FIG. 4 is a circuit diagram of a compensated bias generation module of the compensated current source of the oscillator of FIG. 1 in accordance with at least one embodiment of the present disclosure.

FIG. 4 illustrates a circuit diagram of the compensated bias generation module 150 in accordance with at least one embodiment of the present disclosure. The compensated bias generation module 150 includes p-type transistors 401-406, n-type transistors 407-417, and resistors 420-422. The transistor 401 includes a first current electrode connected to a voltage reference labeled "VDD", a second current electrode, and a control electrode. The transistor 402 includes a first current electrode connected to the VDD voltage reference, a second current electrode, and a control electrode connected to the second current electrode of the transistor 401. The transistor 403 includes first current electrode connected to the VDD voltage reference, a second current electrode, and a control electrode. The transistor 404 includes a first current electrode connected to the VDD voltage reference, a second current electrode, and a control electrode connected to the second current electrode of the transistor 401. The transistor 405 includes a first current electrode connected to the VDD voltage reference, a second current electrode, and a control electrode connected to the second current electrode of the transistor 405. The transistor 406 includes a first current electrode connected to the VDD voltage reference, a second current electrode, and a control electrode connected to the second current electrode of the transistor 405.

The resistor 420 includes a first terminal connected to the VDD voltage reference and a second terminal connected to the control electrode of the transistor 403. The resistor 421 includes a first terminal connected to the VDD voltage reference and a second terminal. The resistor 422 includes a first terminal connected to the second current electrode of the transistor 401 and a second terminal connected to the control electrode of transistor 401.

The transistor 407 includes a first current electrode connected to the control electrode of the transistor 401, a second current electrode connected to a voltage reference labeled "VSS", and a control electrode. The transistor 408 includes a first current electrode connected to the second current electrode of the transistor 402, a second current electrode connected to the VSS voltage reference, and a control electrode connected to the control electrode of the transistor 407 and to the first current electrode of the transistor 408. The transistor 409 includes a first current electrode connected to the second current electrode of the transistor 403, a second current electrode connected to the VSS voltage reference, and a control electrode connected to the first current electrode of the transistor 409. The transistor 410 includes a first current electrode connected to the second current electrode of the transistor 404, a second current electrode connected to the VSS voltage reference, and a control electrode connected to the first current electrode of the transistor 409. The transistor 411 includes a first current electrode connected to the second terminal of the resistor 420, a second current electrode connected to the VSS voltage reference, and a control electrode connected to the second current electrode of the transistor 404.

The transistor 412 includes a first current electrode connected to the second terminal of the resistor 421, a second current electrode connected to the VSS voltage reference, and a control electrode connected to the second current electrode of the transistor 402. The transistor 413 includes a first current electrode connected to the second terminal of the resistor 421, a second current electrode connected to the VSS voltage reference, and a control electrode connected to the second current electrode of the transistor 404. The transistor 414 includes a first current electrode connected to the second current electrode of the transistor 406, a second current electrode connected to the VSS voltage reference, and a control electrode connected to the second terminal of the resistor 421. The transistor 415 includes a first current electrode connected to the second current electrode of the transistor 405, a second current electrode connected to the VSS voltage reference, and a control electrode connected to the second current electrode of the transistor 402. The transistor 416 includes a first current electrode connected to the second current electrode of the transistor 405, a second current electrode connected to the VSS voltage reference, and a control electrode connected to the second current electrode of the transistor 404 The transistor 417 includes a first current electrode connected to the second current electrode of the transistor 406, a second current electrode connected to the VSS voltage reference, and a control electrode connected to the first current electrode of the transistor 417.

In operation, the compensated bias generation module 150 generates a biasing current and using a self-biasing threshold voltage ($V_t$) reference based on a p-type transistor (e.g. a p-type metal oxide semiconductor (PMOS) transistor). This ensures that the bias currents $i_{bias\_osc1}$, $i_{bias\_osc2}$, $i_{bias\_osc3}$, and $i_{bias\_osc4}$ provide at least some compensation for process variations at the respective differential delay cells.

The transistors 401, 402, 407, and 408 and the resistor 422 form a circuit 461 that generates a current that is proportional to absolute temperature (PTAT) of the integrated circuit device that includes the oscillator 100. The transistors 403, 404, 409, 410, and 411 and the resistor 420 form a circuit 462 that generates a current that is complementary to absolute temperature (CTAT) of the integrated circuit device. The resistor 421 and the transistors 412 and 413 form a circuit that combines the PTAT current and the CTAT current and transform the resulting current to a temperature-compensated bias voltage, labeled "$V_{gs\_comp}$". Because $V_{gs\_comp}$ is based on the combination of the PTAT and CTAT currents, it is resistant to variations in temperature at the integrated circuit device.

The circuit formed by the transistors 405, 406, 414, 415, and 416 generates a current, labeled "$i_{vdd\_comp}$", that is proportional to the reference voltage VDD. The connection of the transistor 417 is such that it generates a current, labeled "$i_{out}$" whereby $i_{out}$ can be expressed as follows:

$$i_{out} = i_{gs\_comp} - i_{vdd\_comp}$$

where $i_{gs\_comp}$ is a current generated by the transistors 415 and 416, and the current $i_{vdd\_comp}$ is generated based on the bias voltage $V_{gs\_comp}$. Because $i_{out}$ is based upon $V_{gs\_comp}$ it is resistant to variations in temperature at the integrated circuit device. Further, because $i_{vdd\_comp}$ is subtracted out from the current $i_{gs\_comp}$, the resulting $i_{out}$ is resistant to changes in the voltage reference VDD. This allows the oscillator 100 to be used in relatively low-power applications. In particular, conventional oscillators typically use a reference voltage generated based on a bandgap voltage supply because such a supply is typically stable. However, bandgap voltage supplies typically generate a relatively high voltage and consume a relatively large amount of power. Because of the compensated bias generation module 150, the oscillator 100 can employ a relatively low-power voltage reference that is not based on a bandgap voltage supply, thereby conserving power at the integrated circuit device.

Figure 5:
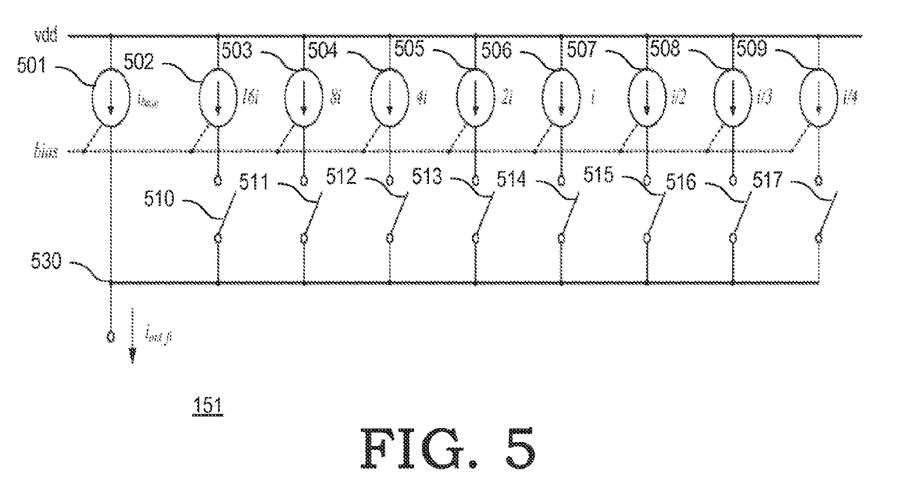
FIG. 5 is a circuit diagram of trimmable current source of the compensated current source of FIG. 1 in accordance with at least one embodiment of the present disclosure.

FIG. 5 illustrates a circuit diagram of the trimmable current source 151 of FIG. 1 in accordance with at least one embodiment of the present disclosure. The trimmable current source includes current sources 501-509, switches 510-517, and a summing node 530. The current sources 501-509 each include a first terminal connected to a voltage reference labeled "VDD" and a second terminal. In addition, each of the current sources 501-509 includes a bias input to receive a bias voltage (labeled "bias") from the compensated bias generation module 150 (FIG. 4). The second terminal of the current source 501 is connected to the summing node 530. Each of the switches 510-517 includes a first terminal connected to a corresponding second terminal of one of the current sources 503-509 and a second terminal connected to the summing node 530.

In operation, each of the current sources 501-509 generates a current based on the bias voltage received at each source. In at least one embodiment, the bias voltage is the voltage $n_{bias\_out}$ generated by the compensated bias generation module 150. Accordingly, the currents generated by the current sources 501-509 are resistant to PVT variations.

Each of the current sources 501-509 generates a current having a different magnitude. In the illustrated example, the current source 501 generates a current designated $i_{base}$, and each of the current sources 502-509 generates a current that is an integer multiple or fractional multiple of the current $i_{base}$. The switches 510-517 control which of the current sources 502-509 are connected to the summing node 530, and therefore which of the currents generated at the current sources 502-509 are used to form the current $i_{out\_ft}$. The connectivity of each switch is set by one or more corresponding cells of a programmable storage module (not shown), such as a register, one-time programmable (OTP) storage device, fuses, and the like.

During a trimming process of the integrated circuit device that includes the oscillator 100, the programmable storage module is set such that each of the switches 510-517 are placed in an open state, so that the current $i_{out\_ft}$ is equal to the current $i_{base}$ as generated by the current source 501. The current $i_{out\_ft}$ is measured and compared to a specified value. If the current differs from the specified value, the programmable storage module is programmed to place selected ones of the switches 510-517 in a closed state, thereby altering the current $i_{out\_ft}$ until it matches the specified value within a specified tolerance. The trimming process thus "fine tunes" the current $i_{out\_ft}$ to account for process variations that can occur during formation of the integrated circuit device.

Figure 6:
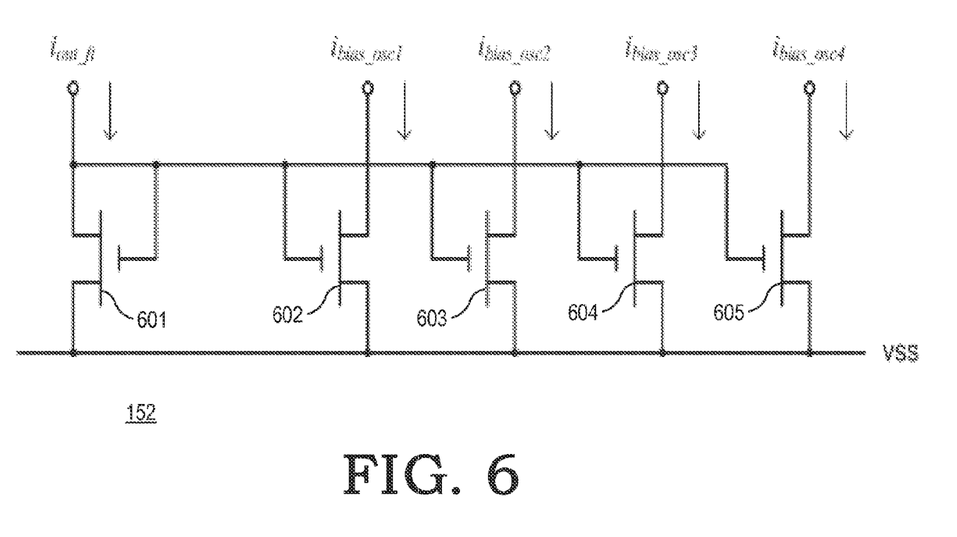
FIG. 6 is a circuit diagram of a current mirror of the compensated current source of FIG. 1 in accordance with at least one embodiment of the present disclosure.

FIG. 6 illustrates the current mirror 152 of FIG. 1 in accordance with at least one embodiment of the present disclosure. The current mirror includes n-type transistors 601-605. The transistor 601 includes a first current electrode to receive the current $i_{out\_ft}$, a second current electrode connected to a voltage reference labeled "VSS" and a control electrode connected to the first current electrode of the transistor 601. Each of the transistors 602-605 includes a first current electrode to provide a corresponding one of the currents $i_{bias\_osc1}$, $i_{bias\_osc2}$, $i_{bias\_osc3}$, and $i_{bias\_osc4}$, respectively, a second current electrode connected to the VSS voltage reference, and a control electrode connected to receive the current $i_{out\_ft}$.

Together with the transistor 601, each of the transistors 602-605 forms a corresponding current mirror to generate the bias currents $i_{bias\_osc1}$, $i_{bias\_osc2}$, $i_{bias\_osc3}$, and $i_{bias\_osc4}$ by mirroring the current $i_{out\_ft}$. Accordingly, each of the bias currents is resistant to PVT variations, thereby ensuring that the CK signal generated at the oscillator 100 is similarly resistant to such PVT variations.

Figure 7:
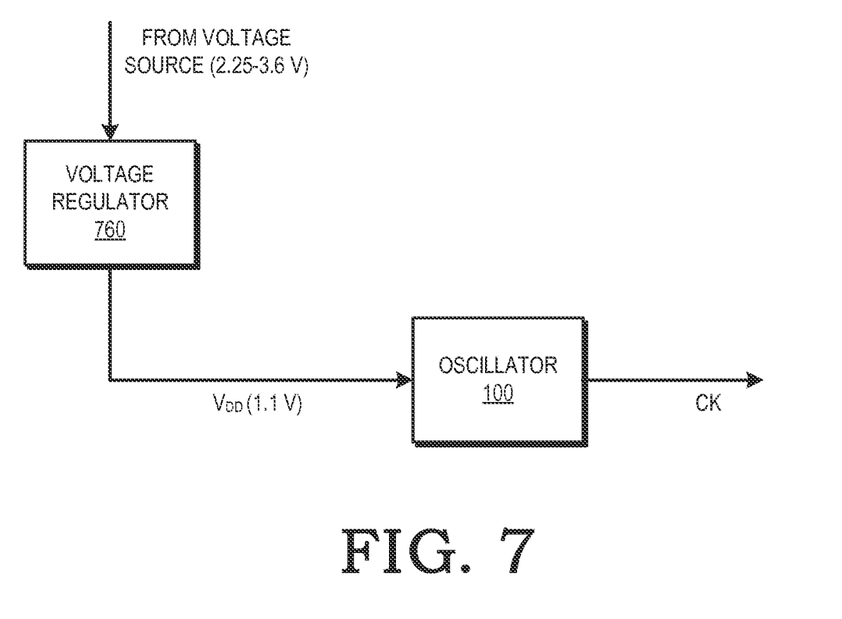
FIG. 7 is a block diagram illustrating provision of a regulated voltage to the oscillator of FIG. 1 in accordance with at least one embodiment of the present disclosure.

FIG. 7 illustrates a block diagram of a voltage regulator 760 that provides the reference voltage VDD to the oscillator 100 in accordance with at least one embodiment of the present disclosure. In the illustrated example, the voltage regulator 760 receives an input voltage from a voltage source (not shown). In at least one embodiment, the voltage source is a reference voltage for the integrated circuit that includes the oscillator 100. In at least one embodiment, the input voltage to the voltage regulator 760 can vary from between 2.25 volts to 3.6 volts. The voltage regulator 760 regulates the input voltage to generate VDD for the oscillator 100 at a magnitude of 1.2 volts within a specified error tolerance. By employing the voltage regulator 760, the voltage VDD is rendered less sensitive to variations in the supply voltage for the integrated circuit that includes the oscillator 100, thereby rendering the frequency of the clock signal CK less sensitive to such variations.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An oscillator comprising:
a plurality of delay cells, each of the plurality of delay cells to delay a respective input signal based on a corresponding plurality of bias currents, the plurality of delay cells to generate an oscillating output signal having a frequency based on the delay; and
a compensated current source to generate the plurality of bias currents, the compensated current source comprising:
a first circuit that generates a first current that is proportional to a temperature of an integrated circuit device;
a second circuit that generates a second current that is complementary to the temperature of the integrated circuit device;
the compensated current source to generate the plurality of bias currents based on a combination of the first current and the second current;
a third circuit to generate a third current proportional to a voltage reference of the oscillator, the compensated current source to generate a bias voltage based on a fourth current, the fourth current generated by subtracting the third current from a fifth current that is based on the combination of the first current and the second current; and
the compensated current source to generate the bias voltage based on the bias voltage.

2. The oscillator of claim 1, wherein the compensated current source further comprises:
a trimmable current source to generate a sixth current based on the bias voltage, the trimmable current source comprising a plurality of current sources selectively coupleable to a summing node based on a value stored at a programmable storage module, wherein the compensated current source is to generate the plurality of bias currents based on the sixth current.

3. The oscillator of claim 2, wherein the compensated current source further comprises:
a plurality of current mirrors to generate the plurality of bias currents based on the sixth current.

4. The oscillator of claim 1, further comprising:
a voltage regulator to provide the voltage reference to the third circuit based on a voltage received from a voltage source.

5. An oscillator comprising:
a plurality of delay cells, each of the plurality of delay cells to delay a respective input signal based on a corresponding plurality of bias currents, the plurality of delay cells to generate an oscillating output signal having a frequency based on the delay;
a compensated current source to generate the plurality of bias currents, the compensated current source comprising:
a first circuit that generates a first current that is proportional to a temperature of an integrated circuit device;
a second circuit that generates a second current that is complementary to the temperature of the integrated circuit device; and
the compensated current source to generate the plurality of bias currents based on a combination of the first current and the second current; and
a pulse generation module to apply a pulse at an input of one of the plurality of delay cells in response to a power-on-reset event at the integrated circuit device.

6. The oscillator of claim 5, wherein each of the plurality of delay cells is a differential delay cell comprising inputs to receive a differential input signal and outputs to provide a differential output signal to another of the plurality of delay cells.

7. The oscillator of claim 6, further comprising a differential buffer comprising:
a differential input coupled to one of the plurality of delay cells; and
a single-ended output to provide a single-ended periodic signal, the differential buffer to convert a differential signal at the input to the single-ended periodic signal.

8. The oscillator of claim 7, further comprising a counter coupled to the single-ended output of the differential buffer.

9. The oscillator of claim 8, wherein the counter comprises:
an output to provide a signal received at the input in response to a value at the counter reaching a threshold.

10. An oscillator comprising:
a plurality of delay cells to generate an oscillating output signal, each of the plurality of delay cells comprising:
an input coupled to an output of another of the plurality of delay cells; and
an output, the output to provide a delayed and inverted representation of a signal received at the input, the delay based on one of a plurality of bias currents;
a compensated current source to generate the plurality of bias currents, the compensated current source comprising:
a first circuit that generates a first current that is proportional to a temperature of an integrated circuit device;
a second circuit that generates a second current that is complementary to the temperature of the integrated circuit device; and
the compensated current source to generate the plurality of bias currents based on a combination of the first current and the second current; and
wherein the first circuit comprises:
a first transistor comprising a first current electrode coupled to a first voltage reference, a second current electrode and a control electrode; and
a second transistor comprising a first current electrode coupled to the control electrode of the first transistor, a second current electrode coupled to a second voltage reference and a control electrode.

11. The oscillator of claim 10, wherein the first circuit further comprises:
a first resistor coupled between the second current electrode of the first transistor and the first current electrode of the second transistor.

12. The oscillator of claim 10, wherein the first circuit further comprises:
a third transistor comprising a first current electrode coupled to the first voltage reference, a second current electrode, and a control electrode coupled to the second current electrode of the first transistor; and
a fourth transistor comprising a first current electrode coupled to the second current electrode of the third transistor, a second current electrode coupled to the second voltage reference, and a control electrode coupled to the first current electrode of the fourth transistor, the control electrode of the second transistor coupled to the first current electrode of the fourth transistor.

13. The oscillator of claim 12, wherein the second circuit comprises:
a fifth transistor comprising a first current electrode coupled to the first voltage reference, a second current electrode, and a control electrode; and
a sixth transistor comprising a first current electrode coupled to the second current electrode of the fifth transistor, a second current electrode coupled to the second voltage reference, and a control electrode coupled to the first current electrode of the sixth transistor.

14. The oscillator of claim 13, wherein the second circuit further comprises:
a seventh transistor comprising a first current electrode coupled to the first voltage reference, a second current electrode, and a control electrode coupled to the second current electrode of the first transistor; and
an eighth transistor comprising a first current electrode coupled to the second current electrode of the seventh transistor, a second current electrode coupled to the second voltage reference, and a control electrode coupled to the first current electrode of the sixth transistor.

15. The oscillator of claim 14, wherein the second circuit further comprises:
a ninth transistor comprising a first current electrode coupled to the control electrode of the fifth transistor, a second current electrode coupled to the second voltage reference, and a control electrode coupled to the second current electrode of the seventh transistor.

16. The oscillator of claim 15, wherein the second circuit further comprises:
a second resistor coupled between the first voltage reference and the first current electrode of the ninth transistor.

17. The oscillator of claim 16, wherein the compensated current source further comprises:
a third resistor comprising a first terminal coupled to the first voltage reference and a second terminal;
a tenth transistor comprising a first current electrode coupled to the second terminal of the third resistor, a second current electrode coupled to the second voltage reference, and a control electrode coupled to the first current electrode of the fourth transistor;
an eleventh transistor comprising a first current electrode coupled to the second terminal of the third resistor, a second current electrode coupled to the second voltage reference, and a control electrode coupled to the second current electrode of the seventh transistor; and
a twelfth transistor comprising a first current electrode coupled to the first voltage reference, a second current electrode coupled to the second voltage reference, and a control electrode coupled to the second terminal of the third resistor.

18. A method implemented at an integrated circuit device, comprising:

generating a first current that is proportional to absolute temperature of an integrated circuit device;
generating a second current that is complementary to absolute temperature of the integrated circuit device;
generating a bias voltage based on a combination of the first current and the second current;
generating a plurality of bias currents based on the bias voltage; and
generating an oscillating signal via a plurality of delay cells based on the plurality of bias currents; and
applying a pulse at an input of one of the plurality of delay cells in response to a power-on-reset event at the integrated circuit device.

* * * * *